(12) United States Patent
Kojima et al.

(10) Patent No.: US 6,433,297 B1
(45) Date of Patent: Aug. 13, 2002

(54) PLASMA PROCESSING METHOD AND PLASMA PROCESSING APPARATUS

(75) Inventors: Akihiro Kojima, Yokohama; Tokuhisa Ohiwa, Kawasaki, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/531,591

(22) Filed: Mar. 20, 2000

(30) Foreign Application Priority Data

Mar. 19, 1999 (JP) .......................................... 11-076354

(51) Int. Cl.$^7$ ................................................ B23K 10/00
(52) U.S. Cl. ................ 219/121.43; 156/345; 118/723 E
(58) Field of Search ...................... 219/121.43, 121.54; 156/345; 204/298.06, 192.13, 192.32; 118/723 E, 723 R, 723 ER, 724, 728; 427/535, 539

(56) References Cited

U.S. PATENT DOCUMENTS 4,579,618 A    4/1986    Celestino et al.
5,900,103 A * 5/1999 Tomoyasu et al. .......... 156/345
6,089,181 A * 7/2000 Suemasa et al. ......... 118/723 E
6,110,287 A * 8/2000 Arai et al. .................. 156/345
6,153,068 A * 11/2000 Ohmi et al. ........... 204/298.06

FOREIGN PATENT DOCUMENTS

| JP | 56-33839 | 4/1981 |
| JP | 10-41281 | 2/1998 |

* cited by examiner

*Primary Examiner*—Teresa Walberg
*Assistant Examiner*—Quang Van
(74) *Attorney, Agent, or Firm*—Finnegan, Henderson, Farabow, Garrett, & Dunner, L.L.P.

(57) ABSTRACT

A plasma processing apparatus includes upper and lower electrodes opposed to each other in an evacuated vessel, a first high-frequency power supply for applying power having a frequency of 27.12 MHz to the lower electrode, a second high-frequency power supply for applying power having a frequency of 3.1 MHz thereto, and a dipole ring for forming a magnetic field between the upper and lower electrodes.

8 Claims, 4 Drawing Sheets

PLASMA PROCESSING METHOD AND PLASMA PROCESSING APPARATUS

CROSS-REFERENCE TO RELATED APPLICATIONS

This application is based upon and claims the benefit of priority from the prior Japanese Patent Application No. 11-076354, filed Mar. 19, 1999, the entire contents of which are incorporated herein by reference.

BACKGROUND OF THE INVENTION

The present invention relates to a plasma processing method and a plasma processing apparatus for processing a subject by plasma generated by high-frequency discharge.

Conventionally there is a reactive ion etching (RIE) method as one of dry etching methods widely used for micromachining in a process of manufacturing semiconductor elements. As the RIE method, magnetron RIE is known in which a magnetic field is employed as plasma to increase the density of the plasma and thus achieve high-speed etching and high-precision micro-machining (U.S. Pat. No. 5,444,207; Jpn. Pat. Appln. KOKAI Publication No. 6-53117; Preliminary Report on 13$^{th}$ Dry Process Symposium of the Institute of Electrical Engineers of Japan, Tokyo, 1991, pp 99–103).

A prior art magnetron plasma processing apparatus will now be described taking a magnetron etching apparatus shown in FIG. 1 as an example.

Figure 1:
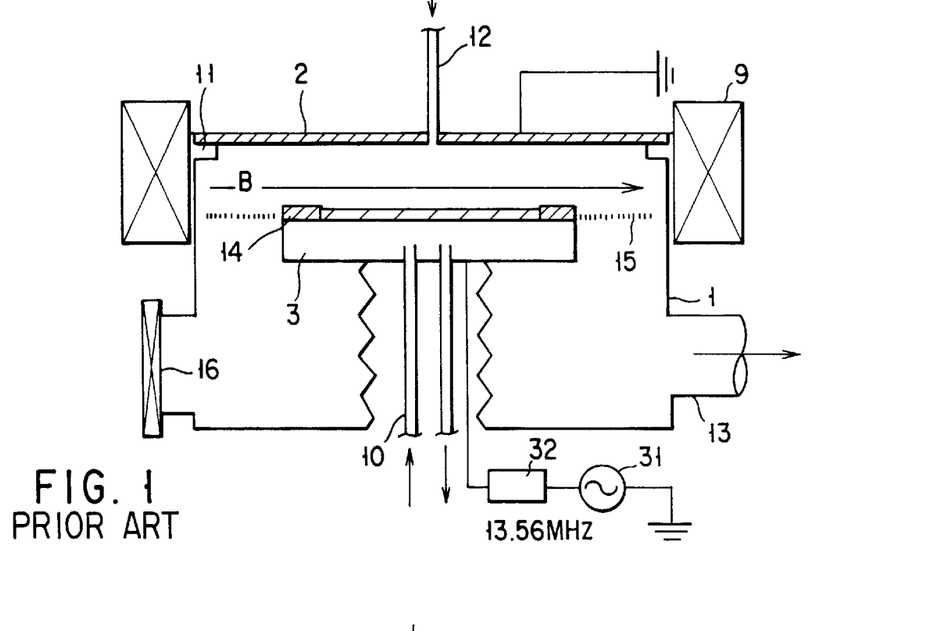
FIG. 1 is a schematic view of a prior art plasma processing apparatus.

Referring to FIG. 1, the apparatus includes an anode mounted on an upper electrode 2 of an upper inner wall of an evacuated vessel 1 and a lower electrode (cathode) 3 opposed to the upper electrode 2 and serving as a support table for supporting a substrate to be processed. Power is generated from a high-frequency power supply 31 and applied between the upper and lower electrodes 2 and 3 through a matching circuit 32.

An electric field E is generated by the electrodes 2 and 3 to form plasma therebetween, and a self-bias electric field is induced on the surface of the lower electrode 3 and thus accelerated reactive ions collide with the surface of the substrate from the plasma, with the result that an etching reaction proceeds.

In the magnetron RIE, a magnetic field B is generated from a dipole ring 9 in a direction perpendicular to the self-bias electric field. In FIG. 1, the magnetic field B is shown in schematic form. If the magnetic fields E and B intersect each other, electrons in the plasma can be drifted in the E×B direction by the Lorentz force. By causing the electrons to travel a long distance by the drift, they come into collision with neutral molecules and atoms with higher frequency, and plasma density is increased. If electrons are confined in plasma by applying a magnetic field and lengthening their lifetime (a time period required until the electrons come into collision with the inner wall of an evacuated vessel, the electrodes and the substrate to be processed), plasma density can be increased further.

The above high-density plasma not only improves an etching rate but also inhibits a radical and a film to be etched from reacting with each other (isotropic reaction). Consequently, even though the pressure of gas lowers, damage can sufficiently be lessened and ion energy, which decreases a selective ratio (of the film to be etched to an underlying film or a mask), can sufficiently be lowered.

The magnetron RIE is currently used for various types of thin film processing since it has excellent characteristics as described above. However, the magnetron RIE has the following problem in a micro-loading effect. Since, in the magnetron RIE, a magnetic field is applied, the directivity of ions incident on a substrate to be processed is disordered and thus the ions enter the substrate obliquely, with the result that an etching rate is lowered in high-anisotropy etching and in etching for patterns whose processing size is small or whose aspect ratio is high.

In the prior art magnetron RIE apparatus as shown in FIG. 1, it is a single high-frequency power supply that is connected to the cathode and the single high-frequency power supply is used to both generate plasma and control the energy of ions incident upon the substrate. Therefore, the energy of ions incident upon the substrate cannot be controlled independently of the density (Ne) of plasma generated between the electrodes and a control range of process is narrowed accordingly.

BRIEF SUMMARY OF THE INVENTION

An object of the present invention is to provide a plasma processing method capable of controlling plasma density and ion energy independently of each other.

Another object of the present invention is to provide a plasma processing apparatus capable of controlling plasma density and ion energy independently of each other.

According to a first aspect of the present invention, there is provided a plasma processing method for applying high-frequency power between upper and lower electrodes opposed to each other in a processing chamber to generate plasma and processing a subject placed on the lower electrode by the plasma, wherein the power applied to the lower electrode has at least two frequencies including a first frequency which is proportional to plasma density and a second frequency a square of which is proportional to the plasma density, thereby generating an electric field intersecting a surface of the subject substantially at right angles.

According to a second aspect of the present invention, there is provided a plasma processing apparatus comprising:

upper and lower electrodes opposed to each other in a processing chamber;

a first power supply for generating power having a frequency which is proportional to a frequency characteristic of plasma density and applying the power to the lower electrode;

a second power supply for generating power having a frequency a square of which is proportional to the frequency characteristic of plasma density and applying the power to the lower electrode; and magnetic-field generation mechanism generating a magnetic field between the upper and lower electrodes.

In the present invention described above, power having a frequency which is proportional to the plasma density and a frequency the square of which is proportional to the plasma density is applied to a single lower electrode. Thus both a frequency for controlling the plasma density and a frequency which ions of plasma can follow independently of the plasma density are provided and consequently high-frequency power for controlling plasma generation and high-frequency power for controlling energy of ions incident upon a subject to be processed can be separated from each other, with the result that the ion incident energy can be controlled independently while making the plasma density uniform. The process control range is therefore expanded to suppress the micro-loading effect in which the etching rate lowers as the etching size reduces.

As compared with a conventional single-frequency power application, the angles of ions incident upon a subject to be processed are inhibited from being varied, and the variations in etching rate due to a pattern size are eliminated by performing etching as plasma processing. The etching thus proceeds in a region where an etch-stop occurred and the etch-stop is cancelled accordingly.

Since it is a single lower electrode that high-frequency power is applied to, high-density plasma can be generated near a subject placed on the lower electrode, with the result that plasma processing is improved in efficiency.

Since, moreover, two frequencies of 27.12 MHz or higher and 5.424 MHz or lower are superposed on each other, high-frequency power having the superposed frequencies can be applied to the same electrode in consideration of control conditions of high- and low-pass filters. The energy of ions can be controlled by the power of 5.424 MHz or lower.

The electric field E and magnetic field B intersect at right angles, so that electrons in plasma can be drifted in the E×B direction by the Lorentz force and caused to travel a long distance. The plasma density is therefore improved.

The plasma processing is performed by DRM (depositional remanent magnetization) or using a magnetic-field generation mechanism capable of rotating around a plasma generating region. Thus, a magnet for applying a magnetic field can be decreased in size and accordingly the apparatus can be miniaturized as a whole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

First Embodiment

Figure 2:
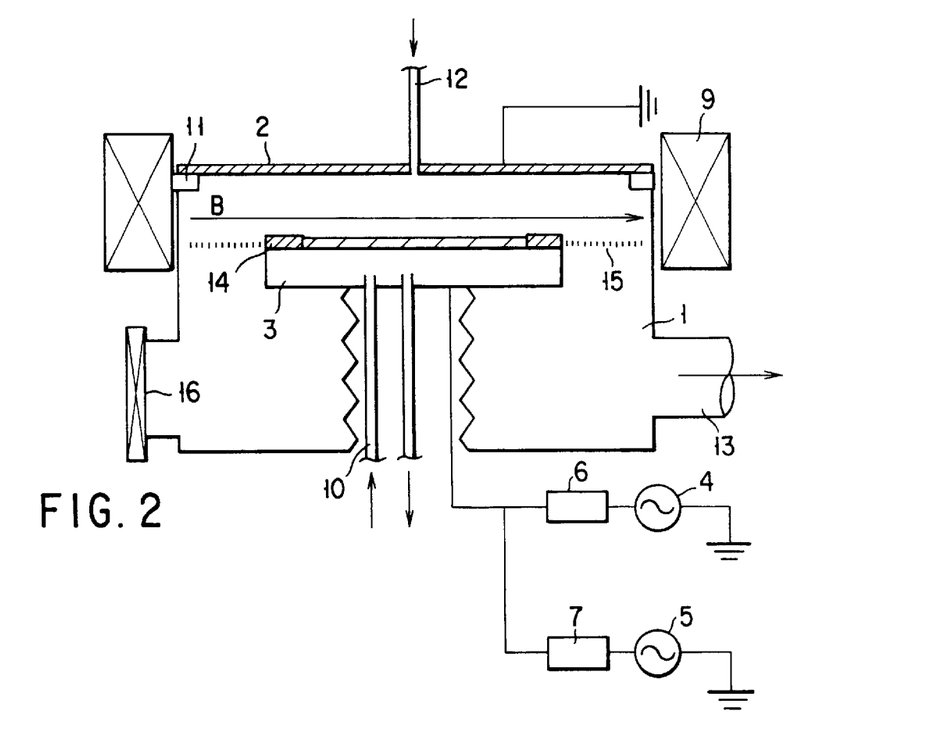
FIG. 2 is a schematic view of a plasma processing apparatus according to a first embodiment of the present invention.

FIG. 2 is a schematic view of the entire structure of a plasma processing apparatus according to a first embodiment of the present invention. This embodiment is directed to etching performed as plasma processing.

As illustrated in FIG. 2, an upper electrode 2 is disposed on the upper inner wall of an evacuated vessel 1 serving as a processing chamber, and a lower electrode 3 serving as a support table for supporting a substrate to be processed is provided in the evacuated vessel 1 so as to face the upper electrode 2.

First and second high-frequency power supplies 4 and 5 are arranged on the side of the lower electrode 3. One terminal of each of the power supplies 4 and 5 is grounded, and the other terminals thereof are connected to their respective matching circuits 6 and 7. The matching circuits 6 and 7 are both connected to the lower electrode 3. The matching circuits 6 and 7 have filtering function. The high-frequency power supply 4 is a 27.12-MHz VHF (very high frequency) band power supply, while the high-frequency power supply 5 is a 1-MHz HF (high frequency) band power supply. The upper electrode 2 is grounded, and an electric field E is generated between the upper and lower electrodes 2 and 3 by the high-frequency power supplies 4 and 5. The electric field E is formed in a direction perpendicular to the surface of the substrate to be processed (not shown).

A dipole ring 9 is provided outside the evacuated vessel 1 and has north and south poles. The north and south poles are opposed to each other, and a plasma generating region is formed between the upper and lower electrodes 2 and 3 and between the opposing north and south poles of the dipole ring 9. Further, the north and south poles can rotate around the plasma generating region to generate a magnetic field B in a direction parallel with the surface of the substrate to be processed (not shown). The magnetic field B intersects the electric field E at right angles.

A cooling pipe 10 is provided in the lower electrode 3 to control the temperature of the substrate with efficiency by a liquid supplied from a liquid supply system (not shown). The reason the cooling pipe 10 is provided is that the density of magnetron plasma of the first embodiment is high and the amount of heat supplied from the plasma to the substrate (not shown) placed on the lower electrode 3 is larger than that in the prior art plasma processing apparatus.

The inner wall of the evacuated vessel 1 is formed so as to be isolated from its underlying region by means of an insulator 11 provided close to the upper electrode 2. Further, a gas supply system 12 for supplying a reactive gas is disposed on the top of the upper electrode 2 and outside the evacuated vessel 1, while a gas exhaust system 13 for exhausting the reactive gas is provided under the evacuated vessel 1.

A protection ring 14 is formed around the substrate to be processed on the lower electrode 3 and constituted of insulating materials which are electrically insulated from reactive ions and the like. The reactive ions generated by plasma are therefore caused to effectively enter only the substrate inside the protection ring 14 to prevent the lower electrode from being directly exposed to the plasma. The materials of the protection ring 14 are selected from among ceramic materials such as SiC, $Al_2O_3$ (alumina), AlN and BN, carbon having various structures such as diamond-like carbon and graphite, silicon, organic substances, metal, alloy, and the like in accordance with a film to be etched and a reactive gas. In the first embodiment, a neodymium system (Nd—Fe) magnet is used; however, it is desirable to select permanent magnet materials such as Sm—Co system, ferrite, and alnico in view of their magnetic-field intensity, resistance and weight.

A baffle plate 15 having a plurality of holes is formed on the outer edge of the lower electrode 3 and between the lower electrode 3 and the inner wall of the evacuated vessel 1 in order to regulate an exhaust stream of gas supplied from the gas supply system 12 and then exhaust the processed gas uniformly from the evacuated vessel 1.

The lower electrode 3 can be moved up and down.

The loading/unloading of wafers in/from the evacuated vessel 1 is performed through a gate valve 16 using a load lock mechanism and a carrying mechanism by lowering the lower electrode 3 below the dipole ring 9.

The reason the frequency of power applied to the lower electrode 3 is set to 27.12 MHz and 3.1 MHz will now be described with reference to FIG. 3.

Figure 3:
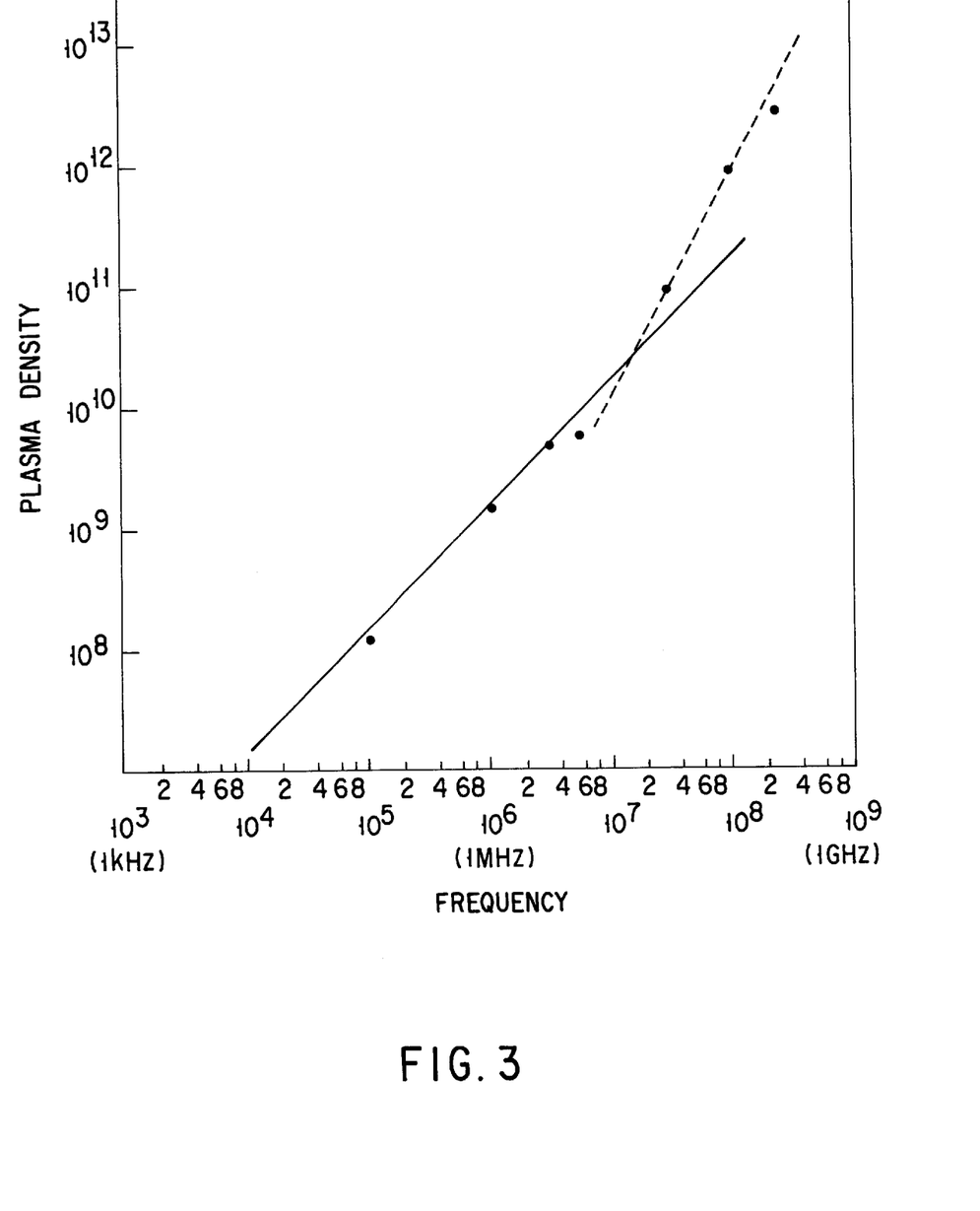
FIG. 3 is a graph showing a relationship between plasma density and ion energy.

FIG. 3 is a graph showing experimental results of the dependence of plasma density upon frequency. In this graph, the horizontal axis indicates the frequency and the vertical axis represents the plasma density. In a parallel-plate electrode using a 30-cm-diameter and 50-cm-height evacuated vessel into which a 15-cm-diameter RF electrode was inserted, as a ground electrode, plasma was generated while varying the frequency in the range from 100 kHz to 300 MHz. A mixture of $C_4F_8/CO/Ar/O_2$ was used as a discharge gas, pressure was set to 40 mTorr, and an RF power supply voltage Vpp was fixed. A 35-GHz microwave interferometer was employed in order to measure the plasma density. FIG. 3 shows variations in plasma density with discharge frequency.

As is seen from FIG. 3, when the frequency is 14 MHz or higher, the plasma density is proportional to the square of the frequency and, when the frequency is 14 MHz or lower, the plasma density is proportional to the frequency. Where the plasma density is proportional to the square of the frequency, the incident energy of ions is low, and where the plasma density is proportional to the frequency, the incident energy is higher than where the plasma density is proportional to the square of the frequency. 14 MHz is a critical point used as a boundary of the frequency. If power having a frequency higher than the boundary and power having a frequency lower than the boundary are superposed on each other, and power having the superposed frequencies is applied to the lower electrode, both ion energy and plasma density can be controlled independently of each other. It is thus necessary to apply such power to the electrode.

A method of etching a silicon oxide film using the plasma processing apparatus according to the foregoing embodiment, will now be described.

First, the lower electrode 3 is lowered from the level of the dipole ring 9, and a substrate to be processed is carried onto the lower electrode 3 in the evacuated vessel 1 through the gate valve 16 by the load lock mechanism and carrying mechanism (neither of which is shown). The substrate is then attracted and fixed to the lower electrode 3 by the Coulomb force of an electrostatic chuck (not shown). The lower electrode 3 is lifted to the level of the dipole ring 9 and set in a position 27 mm away from the upper electrode 2. The substrate to be processed is made of silicon. Before the substrate is carried in the evacuated vessel 1, a 0.2-$\mu$m silicon nitride film is formed on the substrate and then a 1-$\mu$m silicon oxide film is formed on the silicon nitride film. Further, a resist hole pattern is formed on the surface of the silicon oxide film. The substrate is maintained at a temperature of 60° C. by a liquid supplied from the cooling pipe 10.

After that, the vessel 1 is evacuated by the gas exhaust system 13 to have a pressure of about $1\times10^{-6}$ Torr. A mixture of $C_4F_8/CO/Ar/O_2$ is introduced from the gas supply system, and 700-W power in a 27.12-MHz VHF band and 1500-W power in a 3.1-MHz HF band are applied between the upper and lower electrodes 2 and 3 by the high-frequency power supplies 4 and 5, respectively. With application of the high-frequency power, an electric field E is formed in a region between the upper and lower electrodes 2 and 3 in a direction perpendicular to the surface of the substrate to be processed.

On the other hand, the dipole ring 9 rotates at 180 rpm to apply a magnetic field between the upper and lower electrodes 2 and 3. The intensity of the magnetic field inside the rotating dipole ring 9 is set to 200 G; however, it is not limited to 200 G. For example, when a discharge frequency as high as 67.8 MHz is employed, the magnetic-field intensity can be decreased in order to improve the efficiency of discharge. The application of the magnetic field allows a magnetic field B to be formed in a region between the upper and lower electrodes 2 and 3 in a direction parallel to the surface of the substrate to be processed.

In order to prevent plasma from entering, gas is exhausted through the baffle plate 15 whose openings are covered with a metal plate having a slit, the gas exhaust system 13, and a conductance valve (not shown) whose aperture ratio is variable and whose exhaust rate is adjustable, and then supplied to a vacuum pump (not shown). The pressure in the evacuated vessel 1 is set at 40 mTorr by adjusting the conductance valve.

The power generated from the 27.12-MHz VHF band power supply and that generated from the 3.1-MHz HF band power supply are applied between the upper and lower electrodes 2 and 3 through their respective matching circuits 6 and 7. A reactive gas is supplied from the gas supply system 12 into a space where the electric field E and the magnetic field B intersect each other at right angles, and plasma is generated by discharge power from the 27.12-MHz VHF band power supply. The energy-controlled ions, which are extracted from the plasma by the self-bias electric field induced on the surface of the substrate and the electric field generated by the power from the 3.1-MHz HF band power supply, collide with the substrate to thereby make an etching reaction proceed.

The electric field E is applied to the upper and lower electrodes 2 and 3 in a direction perpendicular to the surface of the substrate and the magnetic field B intersects the electric field E at right angles. Electrons in the plasma can thus be drifted in the E×B direction by the Lorentz force. Consequently, the electrons travel a long distance and come into collision with neutral molecules and atoms with higher frequency, thereby increasing the density of the plasma. Since, moreover, a magnetic field is applied, the electrons can be confined in the plasma and their lifetime (a time period required until the electrons come into collision with the inner wall of the evacuated vessel 1, the electrodes 2 and 3, and the substrate to be processed) can be lengthened, with the result that the plasma density can be increased further.

Since, furthermore, power having two different frequencies is applied to the lower electrode 3, high-density plasma is effectively generated near the lower electrode 3 or near the surface of the substrate to be processed and thus the etching reaction is promoted further.

The two frequencies are set at 27.12 MHz and 3.1 MHz and thus the 27.12-MHz frequency controls the plasma density, while the 3.1-MHz frequency does the energy of ions. Both the generation of plasma and the incident energy of ions can thus be controlled independently of each other. The frequency of the first high-frequency power supply 4 has only to be set at 27.12 MHz or higher.

To allow both the plasma density and ion energy to be controlled means expanding a process control range. In other words, the ion energy can freely be controlled while maintaining a uniform plasma density, so that it is not determined uniquely for the plasma density as required, unlike in the prior art, and a desirable experimental condition can easily be satisfied. It is thus possible to prevent the micro-loading effect in which the etching rate lowers as the etching size reduces.

Etching can be performed at low power by applying power having a frequency two times that of 13.56 MHz used conventionally. In other words, the plasma density is proportional to the square of discharge frequency and thus it increases fourfold if the frequency is doubled. If, therefore, plasma is generated at high frequencies rather than low frequencies in order to acquire the same plasma density, power consumption can be decreased.

After the etching, power is cut off from the first and second high-frequency power supplies 4 and 5 to stop supply of gas and exhaust gas remaining in the evacuated vessel 1, and the substrate is removed from the vessel 1 using the load lock mechanism.

In the above process, the etching rate of the silicon oxide film is 61 $\mu$m/min when its hole has a size of 0.1 $\mu$m$\phi$, and it is not lowered if the hole is not smaller than the size (micro-loading effect). The selective ratio of the 'silicon oxide film to its underlying silicon nitride film is 25, while that of the silicon oxide film to the resist serving as a mask is 7.

When only the 1700-W power having a 13.56-MHz frequency was applied to the electrode as in the prior art, the etching rate of 0.58 $\mu$m/min was obtained on conditions that a mixture of $C_4F_8/CO/Ar/O_2$ was used, the pressure in the evacuated vessel 1 was 40 mmTorr, and the size of the hole was 0.3 $\mu$m$\phi$. If, however, a silicon oxide film having a 0.1-$\mu$m$\phi$ hole is etched under the conditions, the etching does not proceed but stops. In this case, the selective ratio of the silicon oxide film to its underlying silicon nitride film was 17, and that of the silicon oxide film to the resist serving as a mask was 5. In the present invention, therefore, the former selective ratio is improved 47% and the latter selective ratio is improved 40%, and the micro-loading effect can be reduced accordingly.

Figure 4:
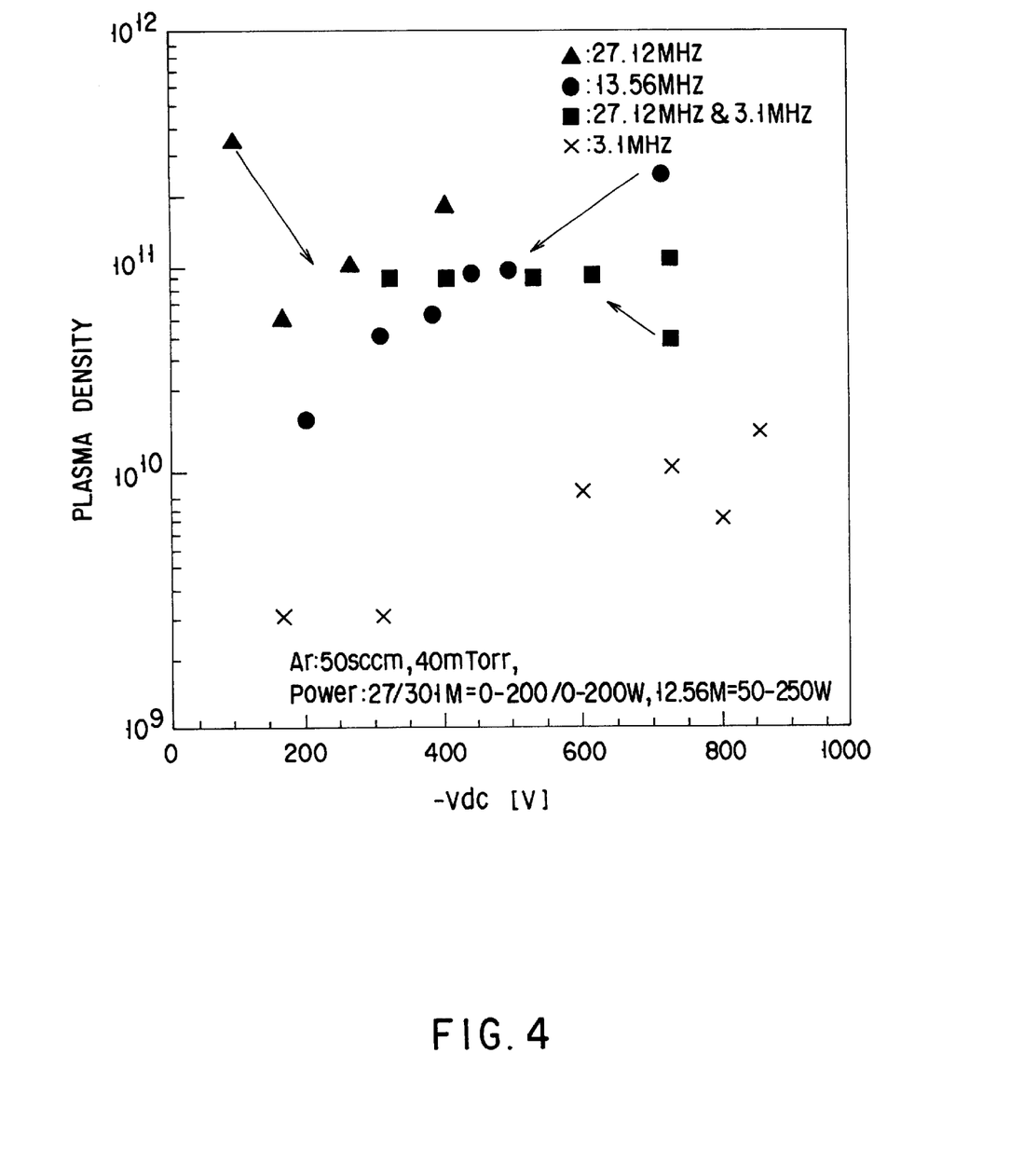
FIG. 4 is a diagram showing a relationship between ion energy and plasma density in the plasma processing according to the first embodiment of the present invention.

FIG. 4 is a graph showing a relationship between ion incident energy (−Vdc) and plasma density (Ne) under the conditions described in the above embodiment. In FIG. 4, the horizontal axis indicates the ion incident energy and the vertical axis does the plasma density. For comparison, the relationships in the prior art plasma processing are also shown in FIG. 4.

As is apparent from FIG. 4, in the prior art plasma processing where power having one of frequencies of 27.12 MHz, 3.1 MHz, and 13.56 MHz is applied, the plasma density increases as the ion incident energy heightens. However, in the embodiment of the present invention where power having superposed frequencies is applied and so is power having a frequency of 27.12 MHz or higher, the plasma density does not increase so greatly as the ion incident energy heightens. This means that any ion energy can be used in order to achieve a desired plasma density. It is thus understood that the process control range is expanded.

The present invention is not limited to the above embodiment. The power generated from the high-frequency power supplies 4 and 5 has only to have a higher frequency of about 14 MHz or more and a lower frequency of about 14 MHz or less in view of a relationship therebetween. Favorably the higher frequency is 27.12 MHz or higher and the lower frequency is 5.424 MHz or lower. The difference in frequency is caused because the higher and lower frequencies need to differ from each other five times or more in consideration of the control conditions of high- and low-pass filters. The number of frequencies of power applied to the single lower electrode 3 is not limited to two but can be three or more in view of experimental conditions or the like.

Figure 5:
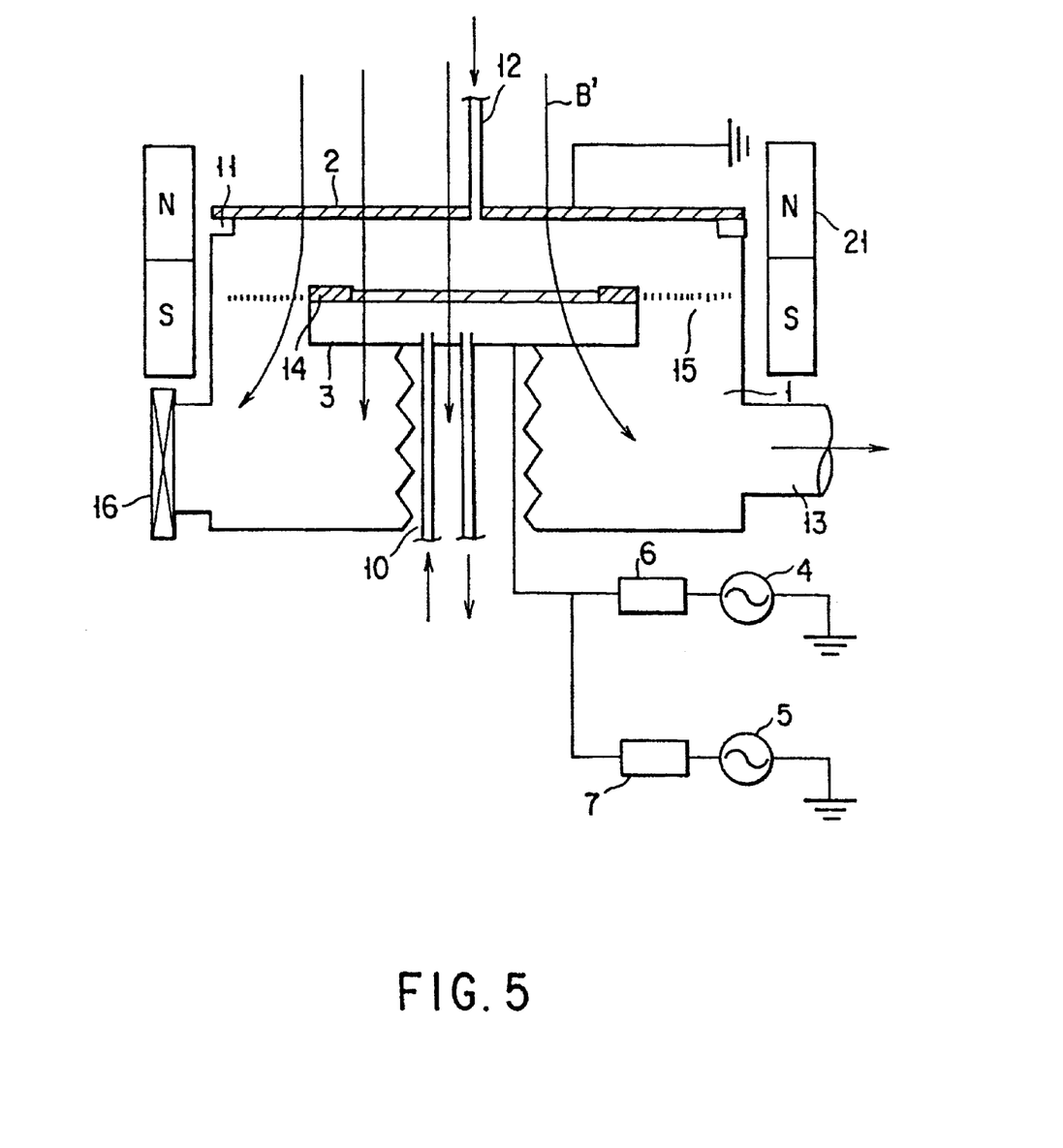
FIG. 5 is a view of a modification to the plasma processing apparatus according to the first embodiment of the present invention.

The present invention can be applied to magnetron plasma using not the dipole ring 9 but a normal magnet. It can also be applied to a structure without using any magnets. Furthermore, as illustrated in FIG. 5, a magnetic-field generation mechanism 21 can be provided, in place of the dipole ring 9, so as to surround a region between the upper and lower electrodes 2 and 3 to generate a magnetic field B' in the vertical direction and form high-density plasma in the vicinity of a substrate to be processed. The constituting elements other than the magnetic-field generation mechanism 21 for generating the magnetic field B' are the same as those in FIG. 2, so that their descriptions are omitted.

In the above embodiment, the matching circuits 6 and 7 are both connected directly to the lower electrode 3, but the present invention is not limited to this case. The matching circuits 6 and 7 may be connected to the lower electrode 3 through a filter (not shown). In this case, the matching circuits 6 and 7 need not function as filter.

According to the present invention described in detail above, power having at least two different frequencies is applied to the lower electrode to generate an electric field E intersecting the surface of a subject substantially at right angles, thus processing the subject by plasma. Since power having a frequency which is proportional to the plasma density and a frequency the square of which is proportional to the plasma density is applied to the lower electrode, both a frequency for controlling the plasma density (Ne) and a frequency which ions of the plasma can follow independently of the plasma density are provided; consequently, high-frequency power for controlling generation of plasma and high-frequency power for controlling energy of ions incident upon the subject to be processed can be separated from each other, and the ion incident energy can be controlled independently while making the plasma density uniform.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing method for applying high-frequency power between upper and lower electrodes opposed to each other in a processing chamber to generate plasma and processing a subject placed on the lower electrode by the plasma, wherein the power applied to the lower electrode has at least two frequencies including a first frequency which is proportional to plasma density and a second frequency a square of which is proportional to the plasma density, thereby generating an electric field intersecting a surface of the subject substantially at the right angles, and wherein the subject is processed by the plasma by generating a magnetic field in a plasma generating region, the magnetic field extending from the upper electrode toward the lower electrode and intersecting the surface of the subject substantially at right angles.

2. The plasma processing method according to claim 1, wherein the first frequency is 5.424 MHz or lower and the second frequency is 27.12 MHz or higher.

3. The plasma processing method according to claim 1, wherein the plasma processing includes processing for etching a silicon oxide film formed on the surface of the subject.

4. A plasma processing apparatus comprising:

upper and lower electrodes opposed to each other in a processing chamber;

first power supply for generating power having a frequency which is proportional to a frequency characteristic of plasma density and applying the power to the lower electrode;

a second power supply for generating power having a frequency a square of which is proportional to the frequency characteristic of plasma density and applying the power to the lower electrode; and a magnetic-field generation mechanism generating a magnetic field between the upper and lower electrodes, wherein the magnetic-field generation mechanism generates a magnetic field in a plasma generating region, the magnetic field extending from the upper electrode toward the lower electrode and intersecting a surface of a subject to be processed substantially at right angles.

5. The plasma processing apparatus according to claim 4, wherein the frequency of the power generated from the first power supply is 5.424 MHz and the frequency of the power generated from the second power supply is 27.12 MHz.

6. A method for manufacturing a semiconductor element, comprising applying high-frequency power between upper and lower electrodes opposed to each other in a processing chamber to generate plasma and processing a silicon substrate placed on the lower electrode by the plasma;

wherein the power applied to the lower electrode has at least two frequencies including a first frequency which is proportional to plasma density and a second frequency a square of which is proportional to the plasma density, thereby generating an electric field intersecting a surface of the silicon substrate substantially at right angles, and wherein the silicon substrate is processed by the plasma by generating a magnetic field in a plasma generating region, the magnetic field extending from the upper electrode toward the lower electrode and intersecting the surface of the silicon substrate substantially at right angles.

7. The method according to claim 6, wherein the first frequency is 5.424 MHz or lower and the second frequency is 27.12 MHz or higher.

8. The method according to claim 6, wherein the plasma processing includes processing for etching a silicon oxide film on the surface of the silicon substrate.

* * * * *

UNITED STATES PATENT AND TRADEMARK OFFICE
CERTIFICATE OF CORRECTION

PATENT NO.   : 6,433,297 B1
DATED        : August 13, 2002
INVENTOR(S)  : Kojima et al.

It is certified that error appears in the above-identified patent and that said Letters Patent is hereby corrected as shown below:

<u>Column 9,</u>
Line 13, change "first power" to -- a first power --.

Signed and Sealed this

Tenth Day of June, 2003

JAMES E. ROGAN
*Director of the United States Patent and Trademark Office*